(12) United States Patent
Yang

(10) Patent No.: US 8,737,072 B2
(45) Date of Patent: May 27, 2014

(54) CONTAINER DATA CENTER WITH WATER TROUGHS

(75) Inventor: Feng-Chi Yang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/491,577

(22) Filed: Jun. 7, 2012

(65) Prior Publication Data

US 2013/0284618 A1    Oct. 31, 2013

(30) Foreign Application Priority Data

Apr. 27, 2012    (CN) .......................... 2012 1 0127339

(51) Int. Cl.
*H05K 7/20*    (2006.01)
*F25D 23/12*    (2006.01)
*F28D 15/00*    (2006.01)

(52) U.S. Cl.
USPC ....... 361/700; 62/259.2; 62/310; 165/104.31; 361/679.46; 361/701; 410/87; 454/184

(58) Field of Classification Search
USPC .............................. 454/184; 62/259–259.43; 165/80.2–80.4, 104.31, 104.33; 361/679.46–679.57, 694, 695, 700, 361/724, 701; 410/33, 87
See application file for complete search history.

(56) References Cited

U.S. PATENT DOCUMENTS

| | | | | |
|---|---|---|---|---|
| 1,936,732 A * | 11/1933 | Renard | ........................... | 62/304 |
| 2,660,863 A * | 12/1953 | Gerhart, Jr. | .................. | 62/259.4 |
| 4,064,706 A * | 12/1977 | Stephens, Jr. | ..................... | 62/64 |
| 4,761,965 A * | 8/1988 | Viner | ........................... | 62/259.4 |
| 7,864,530 B1 * | 1/2011 | Hamburgen et al. | ......... | 361/701 |
| 7,990,710 B2 * | 8/2011 | Hellriegel et al. | ............ | 361/701 |
| 8,184,436 B2 * | 5/2012 | Campbell et al. | ............. | 361/700 |
| 8,223,495 B1 * | 7/2012 | Carlson et al. | ................ | 361/701 |
| 8,351,206 B2 * | 1/2013 | Campbell et al. | ............. | 361/700 |
| 8,419,328 B2 * | 4/2013 | Hsiao | ............................ | 410/87 |
| 8,488,311 B2 * | 7/2013 | Tsai | ........................... | 361/679.46 |
| 8,500,377 B2 * | 8/2013 | Hsiao | .............................. | 410/33 |
| 8,553,416 B1 * | 10/2013 | Carlson et al. | ................ | 361/701 |
| 2012/0067552 A1 * | 3/2012 | Chang | ..................... | 165/104.31 |

* cited by examiner

*Primary Examiner* — Bryon Gehman
(74) *Attorney, Agent, or Firm* — Novak Druce Connolly Bove + Quigg LLP

(57) ABSTRACT

A container data center includes a container. The container includes a top wall, two sidewalls, a first end wall, and a second end wall. Two elongated water troughs are arranged on the top of the container, near the sidewalls. The outer side plate of each water trough is lower than a top side of the corresponding inner side plate. A water receptacle is arranged near the first end plate. Pipes connect the water receptacle to the water troughs, to transfer the water in the water receptacle to the water troughs. When the water in the water troughs overflows, the water flows down the sidewalls of the container, to separate and thus protect the sidewalls from pollutants and humidity in the surrounding air.

4 Claims, 2 Drawing Sheets

CONTAINER DATA CENTER WITH WATER TROUGHS

BACKGROUND

1. Technical Field

The present disclosure relates to a container data center.

2. Description of Related Art

When a container data center is positioned in an area of high salinity, such as a seashore area, the container may corrode, thus reducing the service life of the container data center.

BRIEF DESCRIPTION OF THE DRAWINGS

Many aspects of the present embodiments can be better understood with reference to the drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
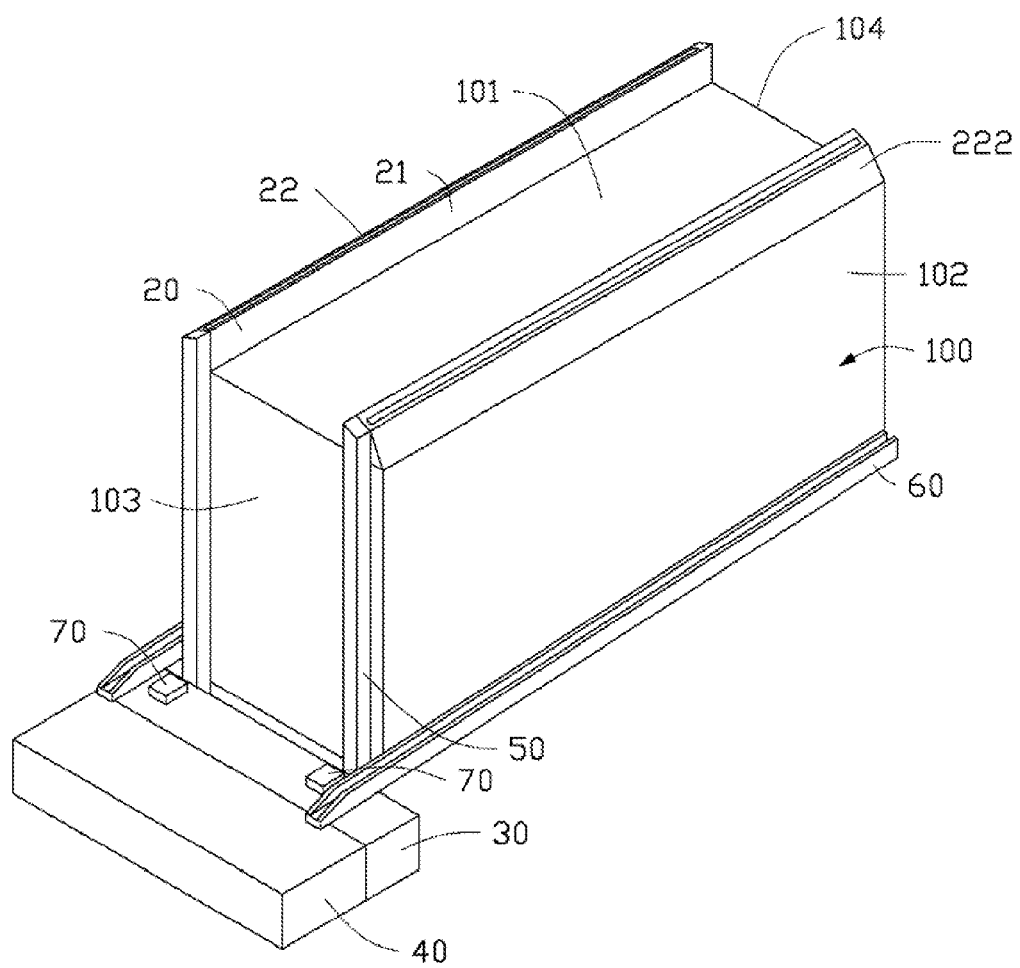
FIG. 1 is an assembled, isometric view of a container data center, according to an exemplary embodiment.

Referring to the FIG. 1, an embodiment of a container data center includes a container 100, two elongated water troughs 20, a water receptacle 30, a recycling bin 40, two pipes 50, and two channels 60.

The container 100 includes a top wall 101, two sidewalls 102 respectively located at two opposite sides of the top wall 101, a first end wall 103, and a second end wall 104, respectively located at two opposite ends of the top wall 101.

The water troughs 20 are arranged on the top wall 101, near the sidewalls 102. Each water trough 20 includes an inner side plate 21 facing the other water trough 20, and an outer side plate 22 substantially lower than a top side of the inner side plate 21, the inner side plate 21 and the outer side plate 22 being connected. A sloping surface 222 is extended down and out from a side of the outer side plate 22 opposite to the inner side plate 21.

The water receptacle 30 is arranged near the first end plate 13. The pipes 50 are positioned at opposite sides of the first end plate 103 and connect the water receptacle 30 to the water troughs 20, to transfer the water in the water receptacle 30 to the water troughs 20 via a pump.

The recycling bin 40 is arranged near the water receptacle 30. The water receptacle 30 is connected to the recycling bin 40, and located between the recycling bin 40 and the first end plate 103.

The channels 60 are located at the bases of the sidewalls 102. Each channel 60 slants down from the second end plate 104 to the first end plate 103. One end of each channel 60 near the first end plate 103 is connected to the recycling bin 40.

Figure 2:
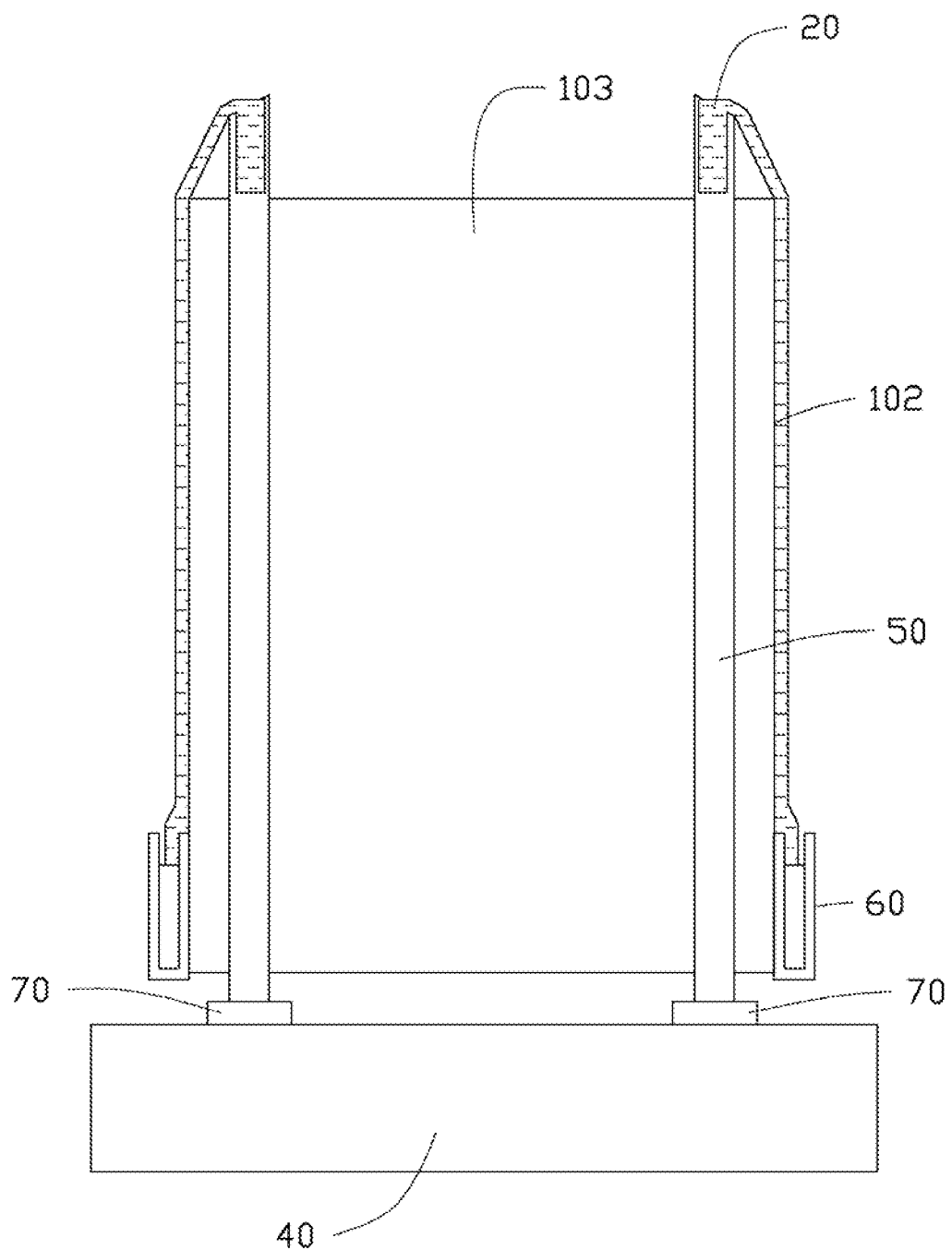
FIG. 2 is a side plan view of FIG. 1.

Referring to the FIG. 2, the pipes 50 transfer the water in the water receptacle 30 to the water troughs 20 via a pump (not shown). When the water in the water troughs 20 overflows, the water flows down along the sidewalls 102 of the container 100, to separate the sidewalls 102 from the air around the sidewalls 102.

The water which flows down is collected in the channels 60, and then flows to the recycling bin 40. The recycling bin 40 percolates the water and transfers the percolated water to the water receptacle 30.

In the embodiment, the water flows down from a top of each sidewall 12 to a bottom of each sidewall 12, which can form a water screen at an outside of each sidewall 12. The water screen provides a cleaning as well as a protective function, and also provides a cooling function to the container 100.

Even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A container data center, comprising:
   a container comprising a top wall, two sidewalls respectively located at two opposite sides of the top wall, a first end wall and a second end wall, respectively located at two opposite ends of the top wall;
   two elongated water troughs arranged on the top wall near the sidewalls respectively, wherein each of the water troughs comprises an inner side plate facing the other water trough, and an outer side plate lower than a top of the inner side plate;
   a water receptacle arranged near the first end wall; and
   two pipes connecting the water receptacle to the water troughs, respectively, to transfer water in the water receptacle to the water troughs via a pump;
   wherein when water in the water troughs overflows, the water flows down from the outer side plates and along the sidewalls of the container, to separate the sidewalls from air around the sidewalls.

2. The container data center of claim 1, wherein a sloped surface is extended from an outer side of each outer side plate to the corresponding sidewall, the water in the water troughs flows down along the sloped surface.

3. The container data center of claim 1, wherein a recycling bin is arranged near the water receptacle, and connected to the water receptacle, two channels are located at bottom portions of the sidewalls, respectively, one end of each of the channels near the first end wall is connected to the recycling bin, the water flowed down from the water troughs is collected in the channels, and then flows to the recycling bin, the water then flows from the recycling bin and flows to the water receptacle.

4. The container data center of claim 3, wherein each of the channels slants down from the second end wall to the first end wall.

* * * * *